United States Patent [19]

Augustin et al.

[11] 4,236,254
[45] Nov. 25, 1980

[54] RADIO RECEIVER BLANKER INHIBIT CIRCUIT

[75] Inventors: Michael J. Augustin; Wade Williams, both of Fort Worth, Tex.

[73] Assignee: Motorola, Inc., Schaumburg, Ill.

[21] Appl. No.: 890,735

[22] Filed: Mar. 27, 1978

[51] Int. Cl.³ .................................................. H04B 1/10
[52] U.S. Cl. ..................................... 455/223; 455/311
[58] Field of Search ............... 325/348, 456, 473, 478, 325/479, 480, 402; 328/165; 455/212, 218, 221–223, 311

[56] References Cited

U.S. PATENT DOCUMENTS

| | | | |
|---|---|---|---|
| 3,079,558 | 2/1963 | Spencer | 325/478 |
| 3,140,445 | 7/1964 | Myers et al. | 325/479 |
| 3,140,446 | 7/1964 | Myers et al. | 325/479 |
| 3,699,457 | 10/1972 | Wright | 325/479 |
| 3,958,181 | 5/1976 | Hansen et al. | 325/480 |
| 3,978,412 | 8/1976 | Frerking | 325/478 |

Primary Examiner—Jin F. Ng
Attorney, Agent, or Firm—James W. Gillman; James A. Scheer

[57] ABSTRACT

The noise blanker of a conventional FM radio is inhibited for several seconds upon closing of the receiver's squelch gate. Following the inhibit period, the blanker is reactivated and again inhibited for the full period upon a subsequent squelch gate closing. Thus, the blanker is inhibited for those signal conditions in which its operation would degrade the overall intelligibility of the processed signal as determined by the squelch control setting.

7 Claims, 2 Drawing Figures

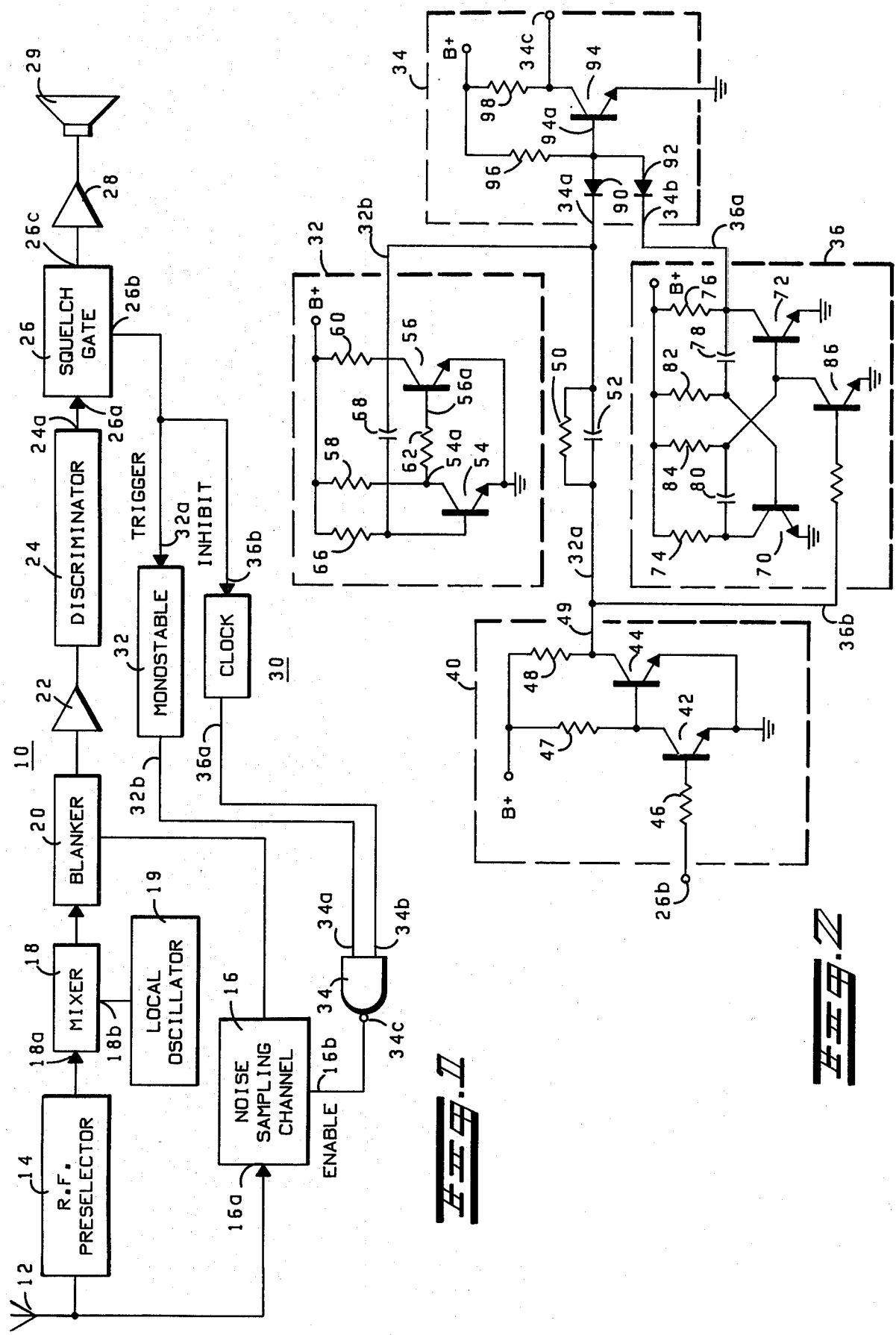

RADIO RECEIVER BLANKER INHIBIT CIRCUIT

BACKGROUND OF THE INVENTION

The present invention pertains to the radio communication art and, more particularly, to an improved radio blanker inhibit circuit.

Blanker circuits, and means for inhibiting the same, are well known in the radio communication art. Commonly, the blanker includes a noise sampling channel and a blanking gate, which gate is in series with the radio processed signal and, prior to a narrow selectivity stage which would otherwise "stretch" the noise pulses causing severe degradation. The noise sampling channel includes means to determine the presence of noise pulses, such as radiation from automobile ignition systems, on the input radio frequency signal and close the blanker gate during the occurrence of such noise pulses.

There are occasions in which operation of the blanker actually degrades the intelligibility of the processed signal. The prior art has developed circuitry to inhibit the blanker operation during two types of signal conditions. In the first, the blanker is inhibited when the repetition rate of the noise pulses exceed a fixed frequency. This is commonly known as rate shut-off.

It has also been known in the prior art to inhibit the blanker circuit when the magnitude of the receiver processed signal exceeds a predetermined threshold level. This is commonly referred to as level shut-off.

There are numerous instances, however, when operation of the blanker circuit degrades the intelligibility of the receiver's output even though either the repetition of the input noise interference is less than the rate shut-off threshold or the magnitude of the receiver processed signal is less than the level shut-off threshold. Thus, there has been a long felt need in the receiver blanker art for inhibit circuitry which inhibits blanker operation under all conditions in which the blanker actually degrades the receiver processed signal.

SUMMARY OF THE INVENTION

It is an object of this invention, therefore, to provide an improved means for inhibiting the blanker of a radio receiver during those instances in which the blanker's operation degrades the receiver's output signal.

It is a further object of the invention to provide an improved method for the inhibiting of the blanker circuit in a radio receiver.

Briefly, according to the invention, the improved blanker circuit, in a conventional radio receiver having a noise sampling channel and blanking circuitry for blanking the noise pulses in the receiver processed signal, comprises a means which senses the relative signal to noise ratio of the receiver processed signal. An inhibitor inhibits blanking circuitry action for a predetermined time period in response to the sense means sensing a predetermined degradation in the receiver signal to noise ratio. Preferably, the sense means activates the inhibitor upon the receiver's squelch circuit closing.

Also, a clock means is provided which inhibits operation of the blanker at predetermined intervals during periods when the squelch gate blocks the receiver's audio signal, i.e. no signal is received.

The method for inhibiting operation of the blanker circuit according to the invention includes monitoring the signal to noise ratio of the signal being processed by the receiver and producing a control signal in response to a predetermined degradation thereof and then inhibiting the blanker circuit operation in response to said produced control signal.

BRIEF DESCRIPTION OF THE DRAWING

FIG. 1 is a block diagram of a conventional radio receiver in combination with a blanker inhibit circuit according to the invention; and FIG. 2 is a detailed schematic diagram of the preferred embodiment of the blanker inhibit circuit.

DETAILED DESCRIPTION OF THE PREFERRED EMBODIMENT OF THE INVENTION

FIG. 1 illustrates a conventional radio receiver indicated generally at 10, in combination with the improved blanker inhibit circuit according to the invention, indicated generally at 30. The radio includes an antenna 12 for receiving radio frequency signals, which signals are fed both to the main receiver channel via RF preselector 14 and to the input 16a of a noise sampling channel 16. The RF preselector 14 is coupled to the input 18a of a conventional mixer stage 18. Applied to the other mixer input 18b is the output from a local oscillator 19. The output 18c from mixer 18 feeds to the input of a conventional blanker gate 20. Blanker gate 20 has a control input 20a for receiving blanking signals from the noise sampling channel circuitry 16. Acting in the conventional manner, the noise sampling channel 16 senses for the presence of noise pulses, and produces an output to blank the signal processed by the radio receiver during the occurrence of said noise pulses.

The output from the blanker 20 feeds to a conventional intermediate frequency stage 22 and then to a conventional discriminator stage 24. The discriminator 24 extracts the information, or audio signal from the intermediate frequency signal at its input and reproduces this information signal at its output 24a.

The information, or audio output from the discriminator 24 is fed to the input 26a of a conventional squelch gate 26.

Acting in the known manner, the squelch gate closes, or blocks the audio signal from appearing at its output 26c if the signal appearing at its input 26a does not exceed the threshold level signal to noise ratio of the receiver processed signal, as set by the squelch control. For control signals at its input 26a which exceed the threshold, squelch gate 26 opens and passes the audio signal to an audio frequency amplifier stage 28. The output from audio frequency amplifier stage 28 is transduced to audibility via a speaker 29.

The blanker inhibit circuitry 30 includes a monostable multivibrator 32 having a trigger input 32a and an output 32b. In this, the preferred embodiment of the invention, monostable multivibrator 32 responds to a trigger pulse at its trigger input 32a to produce a three second timed pulse at its output 32b. The input trigger signal is derived from the squelch gate output 26b.

The pulse output 32b of monostable 32 couples to the first input 34a of a conventional NAND gate 34. The second input 34b of NAND gate 34 is coupled from the output 36a of a clock 36. The clock has a provided inhibit input 36b coupling to the squelch gate 26b output such that when the squelch gate 26 is open the clock 36 is inhibited. In this, the preferred embodiment of the invention, the clock is designed to produce a 20 Hz squarewave at its output 36a.

The output 34c from NAND gate 34 is coupled to an enable input 16b of the noise sampling channel 16. A logic level zero occurring at enable input 16b activates noise sampling channel 16 and allows operation of the blanker 20. Application of the logic one level at the enable input 16b inhibits noise sampling channel 16 and blanker 20.

Operation of the preferred embodiment of the blanker inhibit circuit 30 may be understood as follows. Upon the recovered audio frequency signal at the discriminator output 24a falling below the threshold level of squelch gate 26, thus activating the squelch from an open to a closed state, monostable 32 becomes triggered. As mentioned hereinabove, the signal appearing at the discriminator output 24a is representative of the relative signal to a noise ratio of the signal being processed by the receiver. Thus, a fall in the discriminator recovered audio frequency signal 24a below the threshold of squelch gate 26 represents a predetermined degradation in the signal noise ratio of the receiver processed signal. Monostable multivibrator 32 is triggered only upon a fall of the recovered audio signal below the squelch gate threshold.

Thus, the output from monostable multivibrator 32 is activated for a three second interval. This signal, through gate 34, inhibits noise sampling channel 16 and blanker gate 20. Thus, for a three second period the receiver processed signal is allowed to pass through blanker gate 20 without blanker activity.

After the three second interval, the output of monostable multivibrator 32 returns to a stable state and, via the gate 34, the noise sampling channel 16 and blanker 20 are once again activated. If, during a three second interval, the squelch gate 26 receives a sufficient audio signal at its input 26a to exceed the threshold, it will be open during the time the noise sampling channel 16 and blanker 20 are disabled. Should the enabling of blanker 20 drive the audio output 24a of discriminator 24 below the threshold of squelch gate 26, monostable multivibrator 32 is again triggered for three second period. This, of course, again inhibits noise sampling channel 16 and blanker 20.

Thus, the operation of the instant blanker inhibit circuit causes the blanker to be inhibited if its activation causes a degradation in the signal to noise ratio of the processed radio signal. In so doing, the instant invention provides a precise basis, under any signal condition, for determining those instances in which it is preferable to inhibit the blanker 20.

A condition may occur wherein the squelch gate 26 fails to open solely because of the action of blanker 20. To prevent a system lock up of this type, the clock 36 is provided. During those instances when the squelch gate 26 is closed, the clock circuit 36 is enabled whereby a square-wave of approximately 20 Hz appears at its output 36a. Thus, in this mode, noise sampling channel 16 and blanker 20 are inhibited thus allowing the squelch gate 26 to open if the reason for its being closed was action of the blanker 20. If, upon the noise channel 16 and blanker 20 being enabled the squelch gate 26 reverts to the closed condition and the monostable 32 is again triggered, thereby inhibiting the noise channel 16 and blanker 20 for the predetermined three second period. This procedure then repeats until such time that the operation of the blanker 20 does not degrade the overall performance of the radio 10.

It should be apparent that the instant blanker inhibit circuit is significantly superior to the level or rate shut-off circuits known to the prior art. In the prior art inhibit circuits, the blanker was inhibited only if one of two set conditions were met. In a device according to the instant invention, the blanker is inhibited whenever its operation causes a degradation in the signal to noise ratio of the signal being processed by the receiver.

FIG. 2 is a detailed schematic diagram of the preferred embodiment of the blanker inhibit circuit 30. Here, the squelch gate control output 26b feeds to a buffer stage 40. This stage is of a conventional cascade design using bipolar transistors 42, 44 and associated bias and load resistors 46-48.

The output from buffer stage 40 taken at output node 49 is coupled both to the input 32a of monostable multivibrator 32 and to the inhibit input 36b of the clock 36, here comprised of an astable multivibrator.

The signal appearing at the input 32a of monostable multivibrator 32 is coupled through a parallel resistor 50, capacitor 52 pulse shaping circuit. This circuit produces a pulse for triggering the monostable multivibrator, here comprised of an emitter coupled bipolar transistor pair 54, 56, respectively. Each transistor 54, 56 has a suitable load resistor 58, 60, respectively. The base 56a of the second transistor 56 is connected through a current limit resistor 62 to the collector 54a of the first transistor. A timing resistor 66 and capacitor 68 determine the total on time of the monostable 32.

Thus, when the signal appearing at the squelch input 26a indicates that the signal to noise ratio of the receiver processed signal has fallen by a sufficient amount, a pulse is coupled through resistor 50 and capacitor 52 pulse shaping circuitry to trigger the monostable multivibrator 32 by the closing of the squelch. This produces a three second pulse at its output 32b which couples to the first input 34a of NAND gate 34.

The second input 34b of NAND gate 34 is connected to the output 36a from clock circuit 36. Clock circuit 36 is a conventional astable multivibrator design wherein a pair of transistors 70, 72 have provided load resistors 74, 76, respectively, and corresponding timing capacitors 78, 80 and resistors 82, 84. An inhibit transistor 86 is coupled to the base of the second transistor 72 such that when transistor 86 is biased to saturation, astable operation is inhibited. Thus, in the known manner, the astable multivibrator produces a clock signal at its output 36a, which, in this the preferred embodiment of the invention, is a squarewave having a frequency of approximately 20 Hz.

NAND gate 34 is of conventional diode transistor logic design wherein the cathodes of input diodes 90, 92 connect to the first and second input 34a, b, respectively of the gate 34. The anodes of diodes 90, 92 connect to the base 94a of a transistor 94. Transistor 94 is provided with a base bias resistor 96 and a load resistor 98. Thus, the output 34c of NAND gate 34 is at a high voltage, or a logic one level, for all inputs except when both inputs are at a high state. The output 34c would then connect to the enable input 16b of the noise sampling channel 16, as is shown in FIG. 1.

In summary an improved means of, and method for inhibiting the blanker circuit of a radio receiver has been described. While a preferred embodiment of the invention has been described in detail, it should be apparent that many modifications and variations thereto are possible, all of which fall within the true spirit and scope of the invention.

We claim:

1. An improved blanker circuit for a radio receiver for processing a received signal having a blanker gate and blanking circuitry, the improvement comprising:
   sense means for sensing, after the blanking gate, the relative signal to noise ratio of the receiver processed signal wherein said sense means comprises a squelch gate for squelching audio output of the receiver, said squelch gate responding to a predetermined degradation in said relative signal to noise ratio of said receiver processed signal to block said audio output; and
   inhibitor means for inhibiting blanking action for a predetermined time period in response to said squelch gate sensing said predetermined degradation in said signal to noise ratio and blocking the audio output.

2. The improvement of claim 1 wherein said inhibitor means is comprised of a monostable multivibrator which responds to said predetermined signal to noise degradation to apply a predetermined duration inhibit signal to the blanker.

3. The improvement of claim 2 further comprising;
   clock means for inhibiting operation of the blanker at predetermined intervals during periods when the squelch gate is blocking the audio signal.

4. A method for inhibiting operation of the blanker circuit of a radio receiver comprising the steps of:

(a) monitoring, after the blanker circuit, the signal to noise ratio of a signal being processed by the receiver, using squelch circuitry which acts to block the receiver's output in response to the receiver processed signal falling below a predetermined signal to noise ratio threshold, to perform said monitoring, and to produce a control signal upon said squelch circuit blocking said receiver output; and (b) inhibiting blanker circuit operation in response to said produced control signal.

5. The method of claim 4 wherein step (b) further comprises the step of:
   inhibiting the blanker circuit for a predetermined time period following the occurrence of said produced control signal.

6. The method of claim 5 further comprising the step of:
   (c) periodically inhibiting the blanker during intervals in which the squelch circuit is blocking the audio signal.

7. The method of claim 4 further comprising the step of:
   (c) periodically inhibiting the blanker during intervals in which the squelch circuit is blocking the audio signal.

* * * * *